United States Patent
Kim (10) Patent No.: US 7,816,701 B2
(45) Date of Patent: Oct. 19, 2010

(54) SEMICONDUCTOR LIGHT EMITTING DEVICE

(75) Inventor: Kyung Jun Kim, Gwangiu (KR)

(73) Assignee: LG Innotek Co., Ltd., Seoul (KR)

( * ) Notice: Subject to any disclaimer, the term of this patent is extended or adjusted under 35 U.S.C. 154(b) by 183 days.

(21) Appl. No.: 12/144,184

(22) Filed: Jun. 23, 2008

(65) Prior Publication Data

US 2008/0315178 A1 Dec. 25, 2008

(30) Foreign Application Priority Data

Jun. 21, 2007 (KR) ............... 10-2007-0060934
Jun. 21, 2007 (KR) ............... 10-2007-0060935

(51) Int. Cl.
*H01L 29/167* (2006.01)

(52) U.S. Cl. ............... 257/98; 257/13; 257/86; 257/103; 257/E29.071

(58) Field of Classification Search ........... 257/79–103, 257/918, E29.071, E33.001
See application file for complete search history.

(56) References Cited

U.S. PATENT DOCUMENTS

2008/0303055 A1* 12/2008 Seong ............ 257/103
2009/0256165 A1* 10/2009 Smith et al. ......... 257/94

* cited by examiner

*Primary Examiner*—Evan Pert
*Assistant Examiner*—Scott R Wilson
(74) *Attorney, Agent, or Firm*—Birch, Stewart, Kolasch & Birch, LLP (57) ABSTRACT

A semiconductor light emitting device is provided. The semiconductor light emitting device comprises: a first conductive semiconductor layer; an active layer on the first conductive semiconductor layer; a first quantum dot layer on the active layer; and a second conductive semiconductor layer on the first quantum dot layer.

20 Claims, 6 Drawing Sheets

SEMICONDUCTOR LIGHT EMITTING DEVICE

CROSS-REFERENCE TO RELATED APPLICATIONS

The present application claims priority under 35 U.S.C. 126 and 35 U.S.C. 365 to Korean Patent Application No. 10-2007-0060934 (filed on Jun. 21, 2007) and No. 10-2007-0060935 (filed on Jun. 21, 2007), which is hereby incorporated by reference in its entirety.

BACKGROUND

A III-V group nitride semiconductor has been variously used for an optical device such as blue/green LEDs (light emitting diodes), a high speed switching device such as a MOSFET (metal semiconductor field effect transistor) and a HEMT (hetero junction field effect transistor), a light source of an illumination or a display apparatus, and the like. In particular, a light emitting device using an III group nitride semiconductor has a direct transition-type bandgap corresponding to the range of visible rays to ultraviolet rays, and can perform high efficient light emission.

The nitride semiconductor has been mainly utilized as a LED or a LD (laser diode), and research for improving the manufacturing process or light efficiency had been conducted.

SUMMARY

Embodiments provide a semiconductor light emitting device capable of improving light emitting efficiency by forming a quantum dot layer on or/and below an active layer.

Embodiments provide a semiconductor light emitting device capable of improving light emitting efficiency through p-type roughness by forming a quantum dot layer on an active layer and a cap layer for protecting the quantum dot layer.

Embodiments provide a semiconductor light emitting device capable of improving light emitting efficiency of an active layer by forming a quantum dot layer below the active layer and a cap layer for protecting the quantum dot layer.

An embodiment provides a semiconductor light emitting device comprising: a first conductive semiconductor layer; an active layer on the first conductive semiconductor layer; a first quantum dot layer on the active layer; and a second conductive semiconductor layer on the first quantum dot layer.

An embodiment provides a semiconductor light emitting device comprising: a first conductive semiconductor layer; a second quantum dot layer on the first conductive semiconductor layer; an active layer on the second quantum dot layer; and a second conductive semiconductor layer on the active layer.

DETAILED DESCRIPTION OF THE EMBODIMENTS

Hereinafter, a semiconductor light emitting device will be described with reference to the accompanying drawings.

Figure 1:
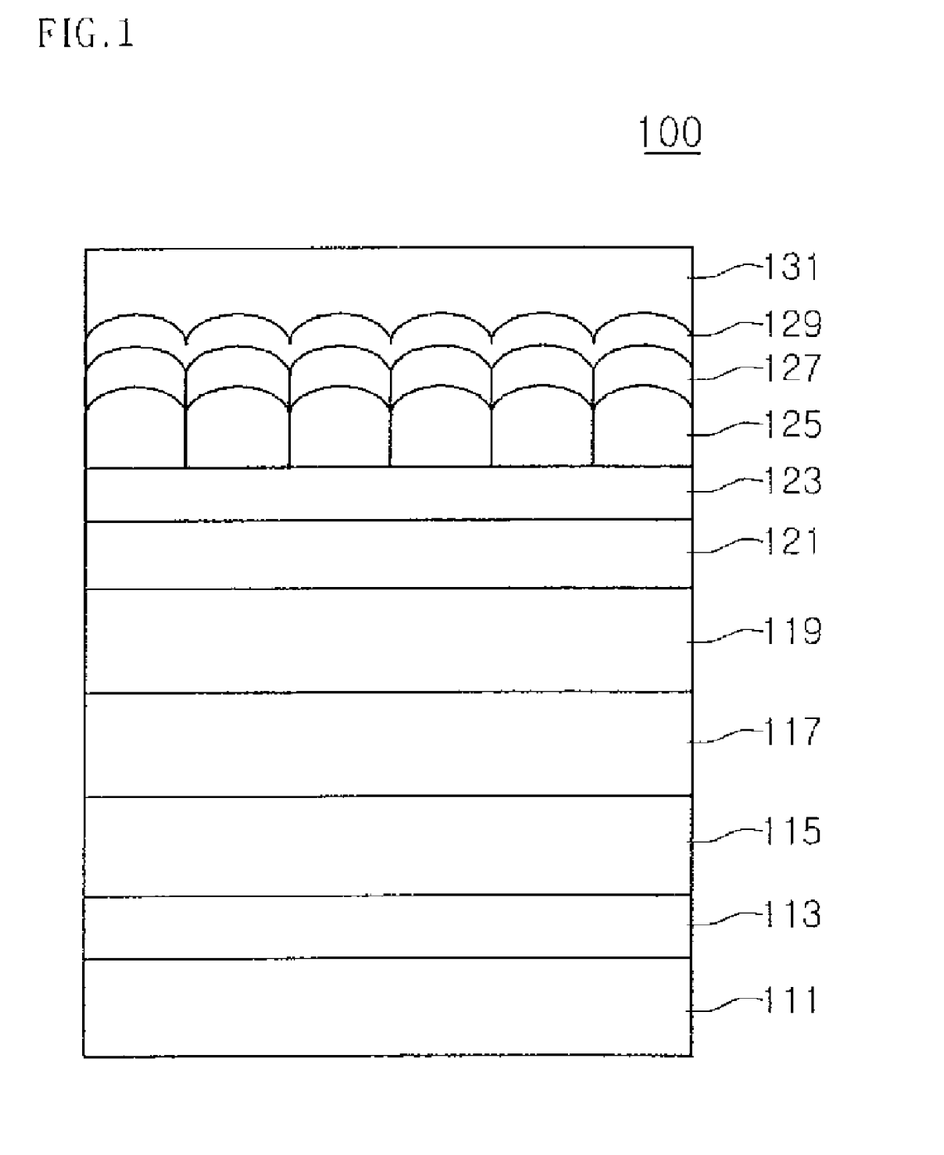
FIG. 1 is a cross-sectional view of a semiconductor light emitting device according to a first embodiment.

FIG. 1 is a cross-sectional view of a semiconductor light emitting device according to a first embodiment.

Referring to FIG. 1, a semiconductor light emitting device 100 comprises a substrate 111, a buffer layer 113, an undoped semiconductor layer 115, a first conductive semiconductor layer 117, a first cladding layer 119, an active layer 121, a second cladding layer 123, a first quantum dot layer 125, a first cap layer 127, a third cladding layer 129, and a second conductive semiconductor layer 131.

The substrate 111 uses at least one among sapphire ($Al_2O_3$), SiC, Si, GaAs, GaN, ZnO, Si, GaP, InP, and Ge, and may be used as a substrate having conductive characteristics. An uneven pattern may be formed on or/and below the substrate 111, and has one of a stripe form, a lens form, a column form, and a hone form.

A nitride semiconductor grows on the substrate 111 by using an E-beam evaporator, physical vapor deposition (PVD), chemical vapor deposition (CVD), plasma laser deposition (PLD), a dual-type thermal evaporator, sputtering, or metal organic chemical vapor deposition (MOCVD), and is not limited thereto.

The buffer layer 113 may be formed on the substrate 111, and the undoped semiconductor layer 115 may be formed on the buffer layer 113. The buffer layer 113 reduces a lattice constant difference between the substrate 111 and the GaN material and may use one among GaN, AlN, AlGaN, AlInN, InGaN and $Al_XGa_YIn_{1-X-Y}N$ ($0 \leq X$, $0 \leq Y$, $X+Y \leq 1$).

The undoped semiconductor layer 115 may be formed of an undoped GaN layer without being doped with a first conductive dopant or a second conductive dopant, and may serve as a substrate where a nitride semiconductor grows. The buffer layer 113 and/or the undoped semiconductor layer 115 may not be formed at all or may not remain in the final device. If the first conductive type is an n-type, the second conductive type is a p-type.

The first conductive semiconductor layer 117 of at least one layer is formed on the undoped semiconductor layer 115. The first conductive semiconductor layer 117 is an n-type, and is formed of a layer comprising at least one among GaN, InN, AlN, InGaN, AlGaN, InAlGaN, and AlInN. A first conductive dopant is doped into the first conductive semiconductor layer 117. The first conductive semiconductor layer 117 may serve as an electrode contact layer that a first electrode layer (not shown) contacts. Here, the first conductive dopant is an n-type dopant and selectively comprises Si, Ge, Se, and Te.

The first cladding layer 119 is formed on the first conductive semiconductor layer 117, and may have a single layer or multilayer structure between the first conductive semiconductor layer 117 and the active layer 121. The first cladding layer 119 may comprise an undoped GaN layer, an n-GaN layer, an n-AlGaN layer or an n-AlInGaN layer, and also may be formed of more than one pair of an n-type $Al_XGa_YIn_{1-X-Y}N/Al_XGa_YIn_{1-X-Y}N$ ($0 \leq X$, $0 \leq Y$, $X+Y \leq 1$). The first cladding layer 119 is not limited thereto. The first cladding layer 119 may not be formed at all.

The active layer 121 is formed on the first cladding layer 119, and is formed with a structure of a single quantum well or multi quantum well structure. The active layer 121 may be formed of an InGaN/GaN structure, InGaN/AlGaN structure, InAlGaN/InAlGaN structure or an AlGaN/GaN structure and is not limited thereto.

At least one second cladding layer 123 is formed on the active layer 121. At least one layer using a semiconductor material (having a large lattice mismatch with respect to the second cladding layer 123) may be formed on the second cladding layer 123. That is, a layer formed on the second cladding layer 123 may be formed in a roughness shape due to the lattice mismatch.

The second cladding layer 123 is doped with a second conductive dopant and has a single layer or multilayer structure. The second cladding layer 123 may be formed of AlGaN or AlInGaN, and is not limited thereto. The second conductive type is a p-type, and the p-type dopant comprises Mg, Zn, Ca, Sr, or Ba.

The first quantum dot layer 125 is formed on the second cladding layer 123, the first cap layer 127 is formed on the first quantum dot layer 125, and the third cladding layer 129 is formed on the first cap layer 127.

The first quantum dot layer 125 (e.g., a nitride layer comprising In) may comprise a material comprising a large lattice mismatch with respect to the second cladding layer 123. The first cap layer 127 serves as protect the first quantum dot layer 125 but may not be formed at all.

The first quantum layer 125 is formed of InGaN. If the second cladding layer 123 is formed of p-AlGaN, the InGaN has a large lattice mismatch with respect to AlGaN. Thus, a quantum dot (QD) can be effectively generated.

The first quantum dot layer 125 may be formed with a predetermined thickness at a predetermined growth temperature by supplying nitrogen or/and hydrogen as a carrier gas, $NH_3$ as an atmosphere gas, TMGa or TEGa as a source gas of Ga, and TMIn as a source gas of In.

Here, when the first quantum dot layer 125 grows, an amount of In (which is 10 to 500 times an amount of Ga) is supplied to form In-rich InGaN QD. A growth temperature of the first quantum dot layer 125 is 600° C. to 800° C., and its growth time is 3 seconds to 30 seconds. Its growth temperature and growth time allow incorporation of In to be smooth, and are not limited the above values.

As the growth time of the first quantum dot (QD) layer 125 increases, the diameter and height of the quantum dot size are increased. Thus, the diameter of the quantum dot size is 50 nm to 200 nm and its height is 1 nm to 20 nm.

Here, because the first quantum dot layer 125 of InGaN has a large lattice mismatch with respect to the second cladding layer 123 of p-type AlGaN, it facilitates the growth of a QD comprising a three-dimensional structure.

Additionally, the first cap layer 127 is formed after the first quantum dot layer 125 grows, and then maintains a quantum dot form of the first quantum dot layer 125 as it is.

Furthermore, the first cap layer 127 may be formed of a GaN cap layer, and may use TMGa or TEGA as a source gas for Ga, and $NH_3$, MMHY or DMHy as a source gas for N. At this point, the first cap layer 127 may be formed of a GaN cap layer of N-rich or Ga-rich. Here, the N-rich or the Ga-rich means a greater amount of N or Ga than an amount of N or Ga of other layers. Additionally, the first cap layer 127 may grow over 3 seconds to 30 seconds at a growth temperature of 600° C. to 800° C., and is not limited thereto.

On the other hand, if the first quantum dot layer 125 and the first cap layer 127 is one pair, there may be one to ten pairs. Additionally, the first quantum dot layer 125 and/or the first cap layer 127 may be doped with a first conductive dopant or a second conductive dopant.

The first quantum dot layer 125 and the first cap layer 127 may be formed on one of the active layer 121, the second cladding layer 123, and the second conductive semiconductor layer 131. That is, they may be formed on any one layer above the active layer 121 to make the layer above the active layer 121 uneven, and are not limited to the formation position of the first quantum dot layer 125 and the first cap layer 127. Additionally, another layer may be formed between the first quantum dot layer 125 and the first cap layer 127, and is not limited thereto.

The third cladding layer 129 is formed on the first cap layer 127, is a layer doped with a second conductive dopant, and may be formed of p-type AlGaN or p-type AlInGaN. The second cladding layer 123 and the third cladding layer 129 may be formed of the same material or respectively different materials.

The second conductive semiconductor layer 131 may be realized with a p-type semiconductor layer doped with a second conductive dopant. The p-type semiconductor layer may comprise a compound semiconductor such as GaN, InN, AlN, InGaN, AlGaN, InAlGaN, and AlInN. The second conductive dopant may be a p-type dopant and may comprise at least one of Mg, Zn, Ca, Sr, and Ba.

The third cladding layer 129 and the second conductive semiconductor layers 131 may be formed with a roughness shape due to a three-dimensional quantum dot structure formed by the quantum dot layer 125. The roughness formed by a QD serves to reduce contact resistance such that electrical characteristics of a device and external quantum efficiency can be improved. The concentration of the roughness is between $1 \times 10^8/cm^2 \sim 5 \times 10^{10}/cm^2$.

A QD of the quantum dot layer 125 is uniformly formed with a small size on the active layer 121. The uniform QD increases carrier confinement and supplies carriers to the active layer 121 more, such that internal light emitting efficiency can be improved in the active layer 121.

A transparent electrode layer (not shown) may be formed on the second conductive semiconductor layer 131. The transparent electrode layer may be formed of one among ITO, ZnO, IrOx, RuOx, and NiO. In the semiconductor light emitting device 100, the first conductive semiconductor layer 117 may be realized with an n-type semiconductor layer and the second conductive semiconductor layer 131 may be realized with a p-type semiconductor layer, and vice versa. Additionally, an n-type semiconductor layer or a p-type semiconductor layer may be formed on the second conductive semiconductor layer 131. Accordingly, the semiconductor light emitting device 100 may be realized with one among an n-p junction structure, a p-n junction structure, an n-p-n junction structure, and a p-n-p junction structure.

Figure 2:
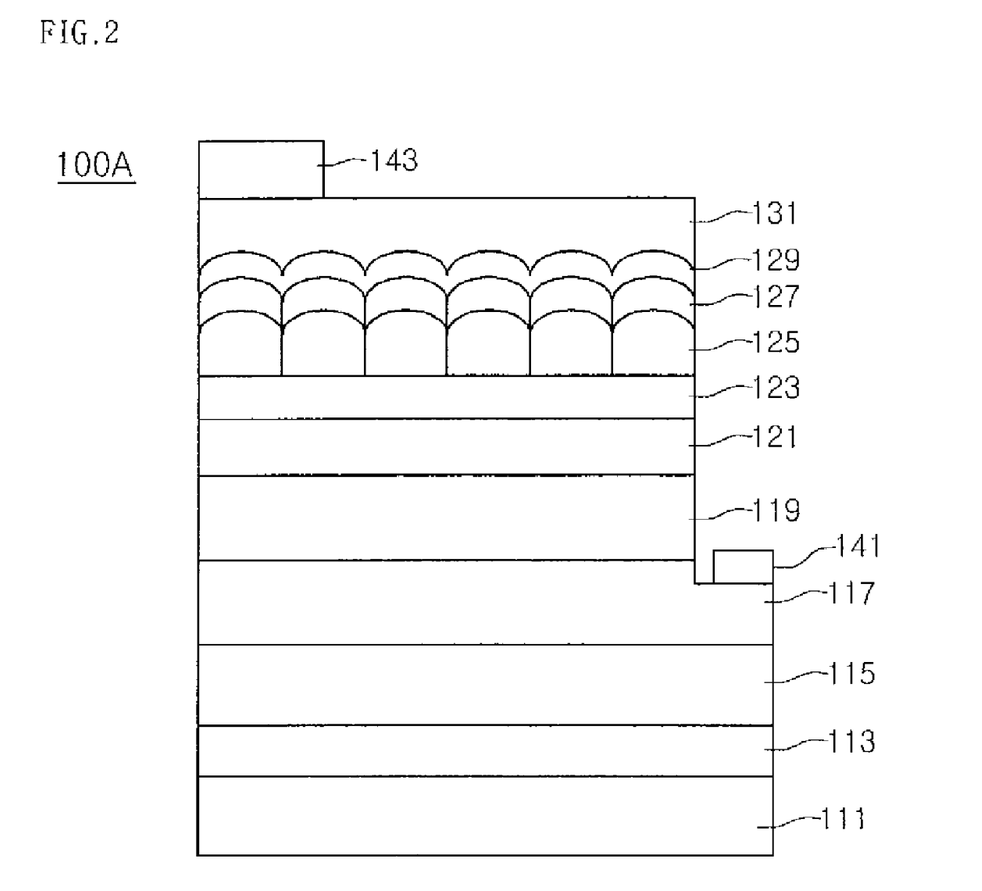
FIG. 2 is a cross-sectional view of a semiconductor light emitting device with reference to FIG. 1.

FIG. 2 is a cross-sectional view of a semiconductor light emitting device with reference to FIG. 1.

Referring to FIG. 2, a semiconductor light emitting device 100A is a horizontal type device. A first electrode layer 141 is formed on a first conductive semiconductor layer 117 and a second electrode layer 143 is formed on a second conductive semiconductor layer 131.

Figure 3:
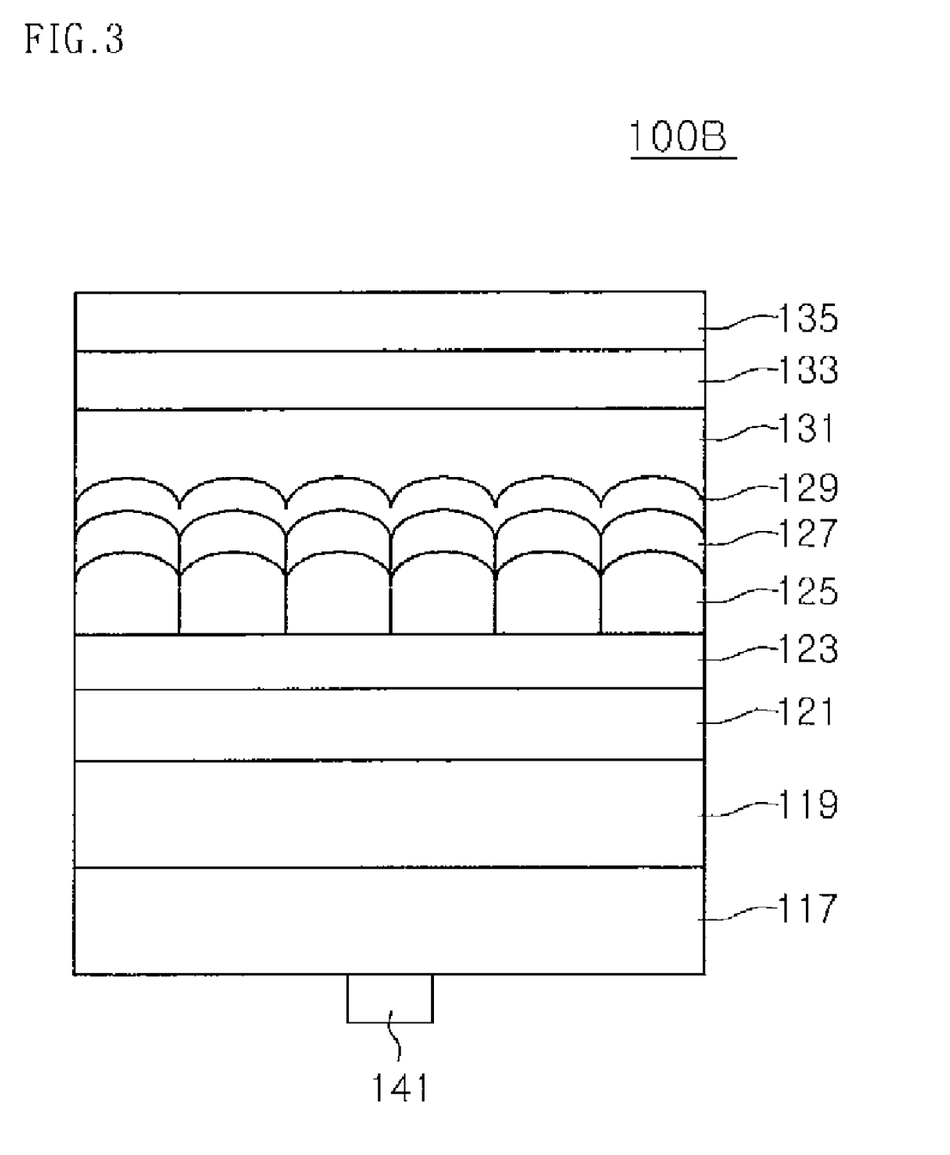
FIG. 3 is a cross-sectional view of a vertical type semiconductor light emitting device with reference to FIG. 1.

FIG. 3 is a cross-sectional view of a vertical type semiconductor light emitting device with reference to FIG. 1.

Referring to FIG. 3, a semiconductor light emitting device 100B is a vertical type device. A reflective electrode layer 133 is formed on a second conductive semiconductor layer 131, and a conductive support substrate 135 is formed on the reflective electrode layer 133. The reflective electrode layer 133 may be formed of one among Al, Ag, Pd, and Rh, and the conductive support substrate 135 may be formed of copper or gold.

Here, the substrate 111, the buffer layer 113, and the undoped semiconductor layer 115 of FIG. 1 are removed by using a physical or/and chemical removing method. Here, according to the physical removing method, the substrate 111 is separated by projecting a laser of a predetermined wavelength, and the buffer layer 113 and the undoped semiconductor layer 115 are removed by using a wet or dry etching method. Additionally, according to the chemical removing method, the substrate 111 is separated by injecting an etchant on the buffer layer 113. The undoped semiconductor layer 115 and the buffer layer 113 may not be removed according to their electrical characteristics. Moreover, a first electrode layer 141 may be formed below the first conductive semiconductor layer 117.

Figure 4:
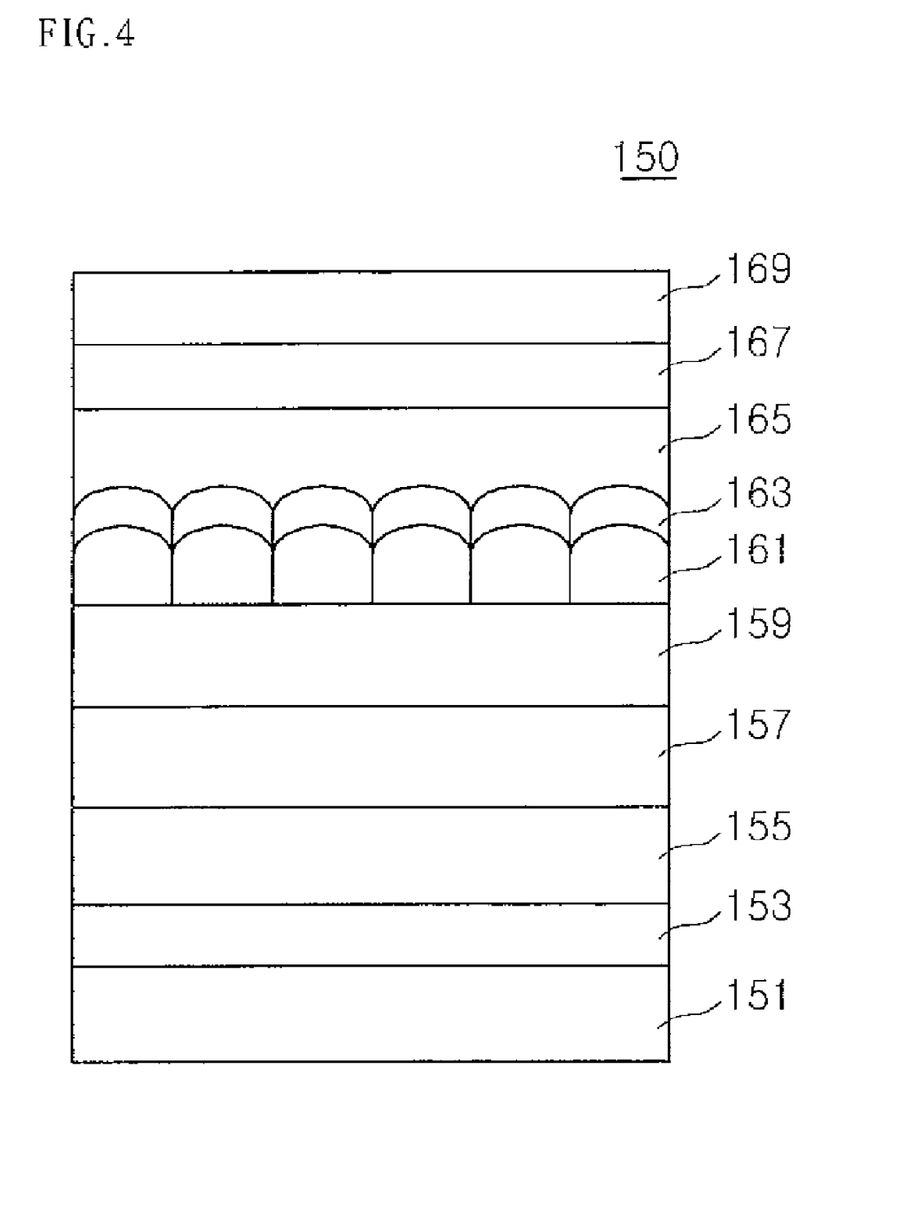
FIG. 4 is a cross-sectional view of a semiconductor light emitting device according to a second embodiment.

FIG. 4 is a cross-sectional view of a semiconductor light emitting device according to a second embodiment. In the description of the second embodiment, like components refer to the description of the first embodiment, and thus its overlapping description will be omitted for conciseness.

Referring to FIG. 4, a semiconductor light emitting device 150 comprises a substrate 151, a buffer layer 153, an undoped semiconductor layer 155, a first conductive semiconductor layer 157, a fourth cladding layer 159, a second quantum dot layer 161, a second cap layer 163, an active layer 165, a fifth cladding layer 167, and a second conductive semiconductor layer 169.

The first conductive semiconductor layer 157 is an n-type and is formed of a layer comprising at least one among GaN, InN, AlN, InGaN, AlGaN, InAlGaN, and AlInN. The first conductive semiconductor layer 157 is doped with a first conductive dopant. The first conductive semiconductor layer 157 may serve as an electrode contact layer that a first electrode layer (not shown) contact. Here, the first conductive dopant may be an n-type dopant and selectively comprises Si, Ge, Se, and Te.

The fourth cladding layer 159 is formed on the first conductive semiconductor layer 157. The fourth cladding layer 159 may not be doped with a dopant or may be doped with a first conductive dopant. The fourth cladding layer 159 may grow into an AlGaN or AlInGaN layer, or may comprise at least one pair of $Al_XGa_YIn_{1-X-Y}N/Al_XGa_YIn_{1-X-Y}N$ ($0 \leq X$, $0 \leq Y$, $X+Y \leq 1$).

The second quantum dot layer 161 is formed on the fourth cladding layer 159, and the second capping dot layer 163 is formed on the second quantum dot layer 161 to protect a QD. The active layer 165 is formed on the second cap layer 163.

When the second quantum dot layer 161 grows, an amount of In (which is 10 to 500 times an amount of Ga) is supplied to form an In-rich InGaN QD. A growth temperature of the second quantum dot layer 161 is between 600° C. and 800° C., and a growth time is between 3 seconds to 30 seconds. The growth temperature and growth time make incorporation of In into the quantum dot layer 161 smooth, and are not limited to the above values.

As the growth time of the second quantum dot layer 161 increases, the diameter and height of the quantum dot size are increased The diameter of the quantum dot size ranges from 50 nm to 200 nm, and its height ranges from 1 nm to 20 nm.

Here, because InGaN of the second quantum dot layer 161 has a large lattice mismatch with respect to AlGaN of the fourth cladding layer 159, it facilitates the growth of a QD comprising a three-dimensional structure.

Then, the second cap layer 163 is formed after the second quantum dot layer 161 grows, and maintains a quantum dot form on the second quantum dot layer 161 as it is.

The second cap layer 163 may be formed of a GaN cap layer, and may use TMGa or TEGA as a source gas for Ga, and $NH_3$, MMHY or DMHy as a source gas for N. At this point, the second cap layer 163 may be formed of a GaN cap layer of N-rich or Ga-rich. Here, the N-rich or the Ga-rich means a greater amount of N or Ga than an amount of N or Ga of other layers. Additionally, the second cap layer 163 may grow over 3 seconds to 30 seconds at a growth temperature of 600° C. to 800° C., and is not limited thereto.

On the other hand, if the second quantum dot layer 161 and the second cap layer 163 is one pair, there may be 1 to 10 pairs. Additionally, the second quantum dot layer 161 and/or the second cap layer 163 may be doped with a first conductive dopant.

An active layer 165 is formed on the second cap layer 163, and the active layer 165 has a single quantum well or multi quantum well (MQW) structure and may be formed of $Al_XGa_YIn_{1-X-Y}N/Al_XGa_YIn_{1-X-Y}N$ ($0 \leq X$, $0 \leq Y$, $X+Y \leq 1$).

The fifth cladding layer 167 is formed on the active layer 165, and the second semiconductor layer 169 is formed on the fifth cladding layer 167.

A QD of the second quantum dot layer 161 is uniformly formed with a small size below the active layer 165. The uniform QD increases carrier confinement and increases a supply of carriers in the active layer 165. Therefore, internal light emitting efficiency can be improved in the active layer 165.

The fifth conductive cladding layer 167 may be formed of p-type AlGaN or p-type AlInGaN. The fifth cladding layer 167 and the fourth cladding layer 159 may be formed of the same material or respectively difference materials. The fifth cladding layer 167 may not be formed at all.

The second conductive semiconductor layer 169 may be realized with a p-type semiconductor layer doped with a second conductive dopant. The p-type semiconductor layer may be formed of one among compound semiconductors such as GaN, InN, AlN, InGaN, AlGaN, InAlGaN, and AlInN. The second conductive dopant is a p-type dopant and at least one among Mg, Zn, Ca, Sr, and Ba is added to the second conductive dopant.

A transparent electrode layer (not shown) may be formed on the second conductive semiconductor layer 169. The transparent electrode layer may be formed of one among ITO, ZnO, IrOx, RuOx, and NiO. In the semiconductor light emitting device 150A, the first conductive semiconductor layer 157 may be realized with an n-type semiconductor layer and the second conductive semiconductor layer 169 may be realized with a p-type semiconductor layer, and vice versa. Additionally, an n-type semiconductor layer or a p-type semiconductor layer may be formed on the second conductive semiconductor layer 169. Accordingly, the semiconductor light emitting device 150 may be realized with one among an n-p junction structure, a p-n junction structure, an n-p-n junction structure, and a p-n-p junction structure.

Figure 5:
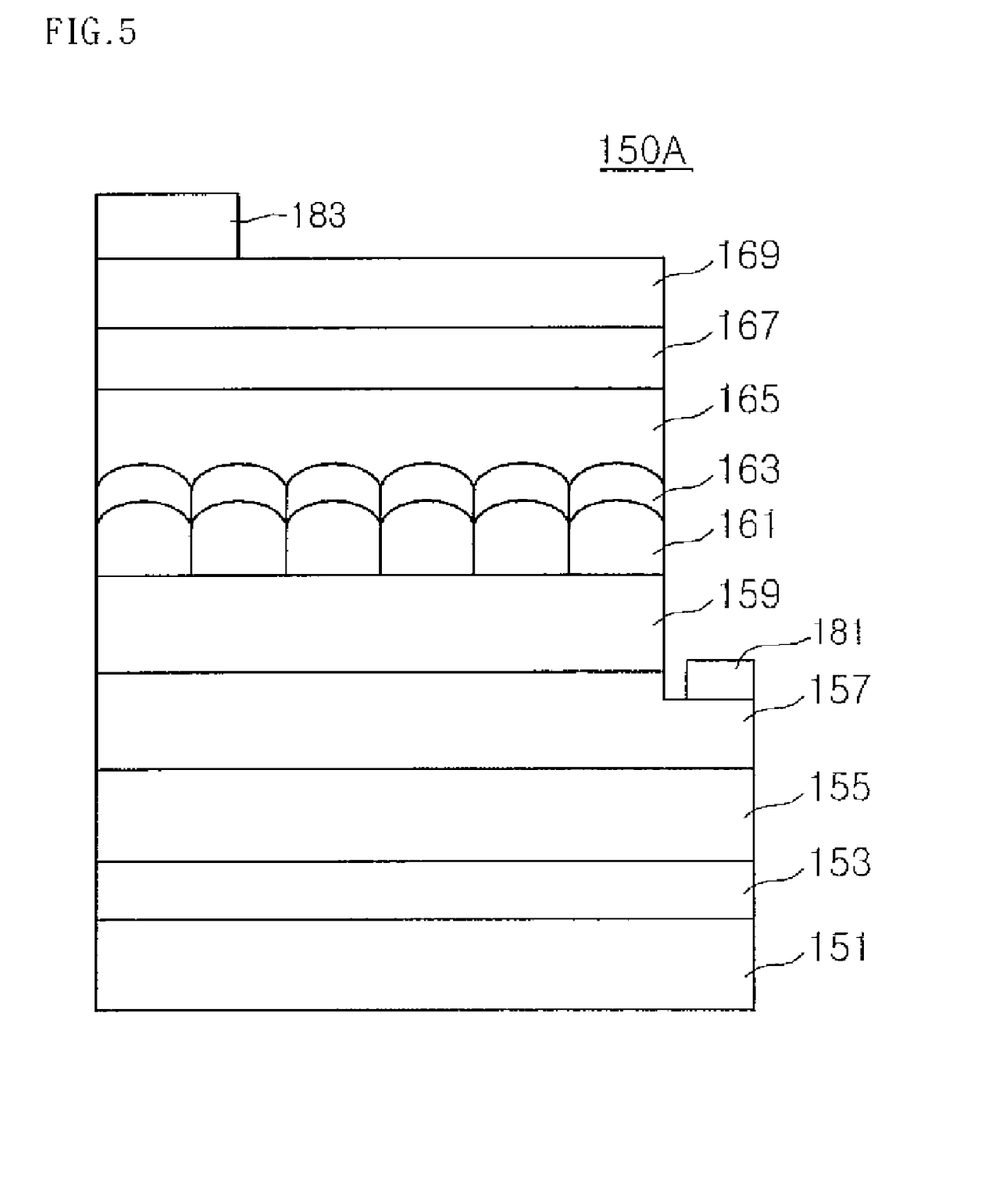
FIG. 5 is a cross-sectional view of a semiconductor light emitting device with reference to FIG. 4.

FIG. 5 is a cross-sectional view of a semiconductor light emitting device with reference to FIG. 4.

Referring to FIG. 5, the semiconductor light emitting device 150A is a horizontal type device A first electrode layer 181 is formed on the first conductive semiconductor layer 157 and a second electrode layer 183 is formed on the second conductive semiconductor layer 169.

Figure 6:
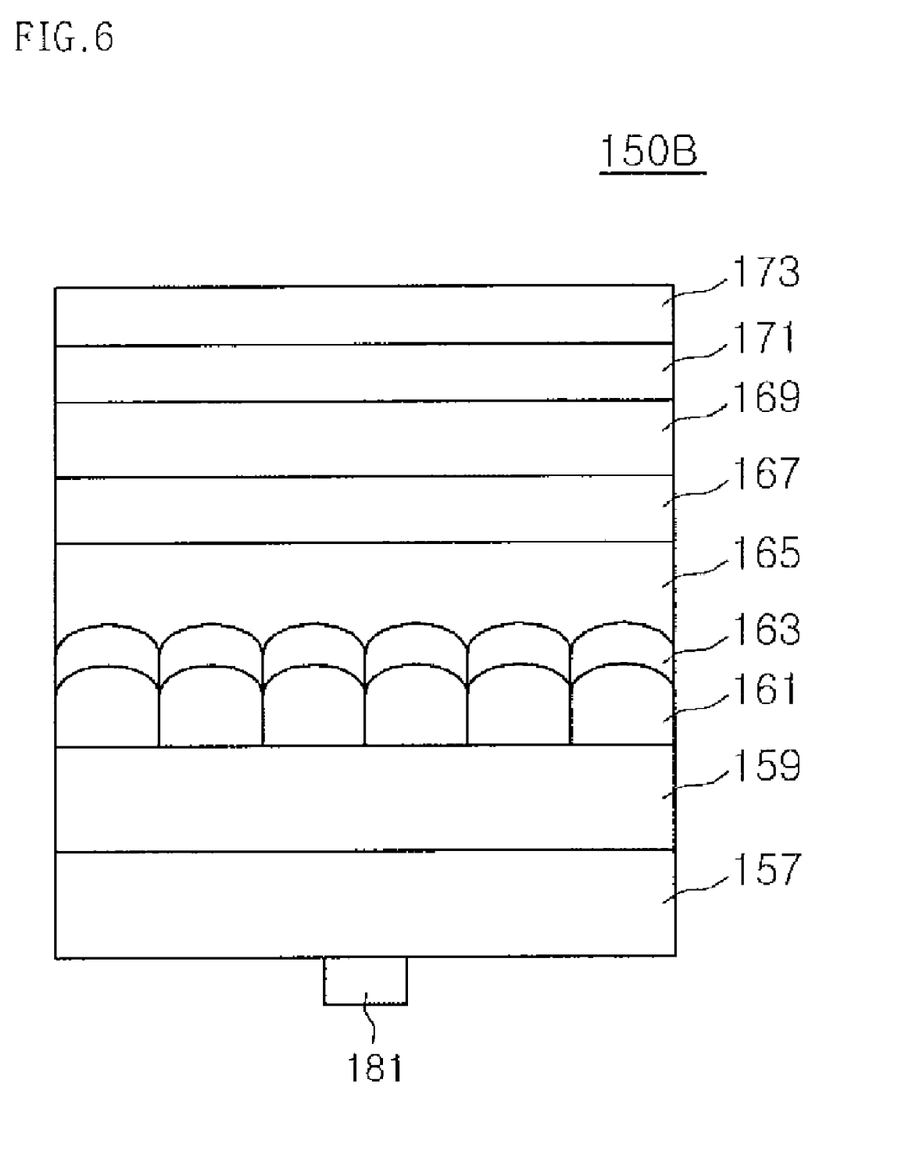
FIG. 6 is a cross-sectional view of a vertical semiconductor light emitting device with reference to FIG. 4.

FIG. 6 is a cross-sectional view of a vertical semiconductor light emitting device with reference to FIG. 4.

Referring to FIG. 6, a semiconductor light emitting device 150B is a vertical type device. A reflective electrode layer 171 is formed on the second conductive semiconductor layer 169, and a conductive support substrate 173 may be formed on the reflective electrode layer 171. The reflective electrode layer

171 may be formed of one among Al, Ag, Pd, and Rh, and the conductive support substrate 173 may be formed of copper or gold.

Here, the substrate 151, the buffer layer 153, and the undoped semiconductor layer 155 of FIG. 4 are removed by using a physical or/and chemical removing method. Here, according to the physical removing method, the substrate 151 is separated by projecting a laser of a predetermined wavelength, and the buffer layer 153 and the undoped semiconductor layer 155 are removed by using a wet or dry etching method. Additionally, according to the chemical removing method, the substrate 151 is separated by injecting an etchant on the buffer layer 153. The undoped semiconductor layer 155 and the buffer layer 153 may not be removed according to their electrical characteristics. Moreover, a first electrode layer 181 may be formed below the first conductive semiconductor layer 157.

In the above embodiments, the first embodiment comprises a structure in which a quantum dot layer is formed on an active layer, and the second embodiment comprises a structure in which a quantum dot layer is formed below an active layer. Accordingly, because the quantum dot layer is selectively formed on and/or below the active layer according to the first and second embodiments, internal light emitting efficiency can be improved.

In the description, it will be understood that when a layer (or film) is referred to as being "on" or "under" another layer, it can be directly or indirectly "on" or "under" the another layer.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
a first conductive semiconductor layer;
an active layer on the first conductive semiconductor layer;
a first quantum dot layer on the active layer; and
a second conductive semiconductor layer on the first quantum dot layer.

2. The semiconductor light emitting device according to claim 1, comprising a first cladding layer between the active layer and the first quantum dot layer, the first cladding layer being doped with a second conductive dopant and comprising AlGaN or AlInGaN.

3. The semiconductor light emitting device according to claim 1, wherein the first quantum dot layer comprises an InGaN layer.

4. The semiconductor light emitting device according to claim 1, comprising a first cap layer on the first quantum dot layer.

5. The semiconductor light emitting device according to claim 4, wherein the first cap layer comprises a GaN layer.

6. The semiconductor light emitting device according to claim 4, wherein the first cap layer comprises an N-rich GaN layer or a Ga-rich GaN layer.

7. The semiconductor light emitting device according to claim 4, wherein the first quantum dot layer and the first cap layer comprise one to ten pairs of the first quantum dot layer and the first cap layer.

8. The semiconductor light emitting device according to claim 4, wherein at least one of the first quantum dot layer or/and the first cap layer comprises a first conductive dopant or a second conductive dopant.

9. The semiconductor light emitting device according to claim 1, wherein a quantum dot comprising a three-dimensional structure is formed in the first quantum dot layer, a diameter of the quantum dot is 50 nm to 200 nm, and a height of the quantum dot is 1 nm to 20 nm.

10. The semiconductor light emitting device according to claim 1, wherein the first quantum dot layer is doped with an amount of In that is 10 to 500 times an amount of Ga.

11. The semiconductor light emitting device according to claim 1, wherein the first quantum dot comprises a plurality of quantum dots such that an upper surface of the first quantum dot layer is rough.

12. The semiconductor light emitting device according to claim 1, comprising a first cladding layer between the active layer and the first quantum dot layer, and a second cladding layer between the first quantum layer and the second conductive semiconductor layer.

13. A semiconductor light emitting device comprising:
a first conductive semiconductor layer;
a first quantum dot layer on the first conductive semiconductor layer;
an active layer on the first quantum dot layer; and
a second conductive semiconductor layer on the active layer.

14. The semiconductor light emitting device according to claim 13, comprising a first cladding layer between the first conductive semiconductor layer and the first quantum dot layer, the first cladding layer comprising at least one of an AlGaN layer, an AlInGaN layer, and a pair layer of $Al_XGa_YIn_{1-X-Y}N/Al_XGa_YIn_{1-X-Y}N$ ($0 \leq X$, $0 \leq Y$, $X+Y \leq 1$).

15. The semiconductor light emitting device according to claim 13, comprising a first cap layer on the first quantum dot layer, wherein the first quantum dot layer is an InGaN layer, and the first cap layer comprises a GaN layer.

16. The semiconductor light emitting device according to claim 15, wherein the first quantum dot layer is formed of an In-rich InGaN layer, and the first cap layer is formed of a Ga-rich GaN layer or an N-rich GaN layer.

17. The semiconductor light emitting device according to claim 13, comprising:
a second cladding layer doped with a second conductive dopant on the active layer;
a second quantum dot layer on the second cladding layer; and
a second cap layer on the second quantum dot layer.

18. The semiconductor light emitting device according to claim 13, comprising an n-type semiconductor layer on the second conductive semiconductor layer which is a p-type semiconductor.

19. The semiconductor light emitting device according to claim 13, comprising a first electrode layer below the first conductive semiconductor layer and at least one of a reflective electrode layer and a conductive substrate on the second conductive semiconductor layer.

20. The semiconductor light emitting device according to claim 13, comprising:
   a first cladding layer between the first conductive semiconductor layer and the second quantum dot layer; and
   a second cladding layer between the active layer and the second conductive semiconductor layer.

* * * * *